United States Patent [19]
Yoon et al.

[11] Patent Number: 6,117,350
[45] Date of Patent: *Sep. 12, 2000

[54] ADJUSTABLE SELECTIVITY ETCHING SOLUTIONS AND METHODS OF ETCHING SEMICONDUCTOR DEVICES USING THE SAME

[75] Inventors: Byoung-moon Yoon; Young-min Kwon; Yong-sun Ko; Myung-jun Park, all of Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/684,034

[22] Filed: Jul. 19, 1996

[30] Foreign Application Priority Data

Jul. 28, 1995 [KR] Rep. of Korea .................. 95-22945

[51] Int. Cl.[7] .................................................. H01L 21/302
[52] U.S. Cl. ........................... 216/99; 216/108; 216/109; 438/756
[58] Field of Search .................. 252/79.3, 79.4; 216/99, 108, 109; 438/753, 756

[56] References Cited

U.S. PATENT DOCUMENTS

| | | | |
|---|---|---|---|
| 3,860,464 | 1/1975 | Erdman et al. | 252/79.3 |
| 4,517,106 | 5/1985 | Hopkins et al. | 252/79.4 |
| 4,582,624 | 4/1986 | Enjo et al. | 252/79.4 |
| 4,761,244 | 8/1988 | Scardera et al. | 252/79.3 |
| 4,795,582 | 1/1989 | Ohmi et al. | 252/79.4 |
| 5,374,329 | 12/1994 | Miyawaki | 148/DIG. 12 |
| 5,454,901 | 10/1995 | Tsuji | 438/753 |
| 5,466,631 | 11/1995 | Ichikawa et al. | 438/406 |
| 5,536,361 | 7/1996 | Kondo et al. | 156/630.1 |

FOREIGN PATENT DOCUMENTS

| | | |
|---|---|---|
| 59-142718A | 8/1984 | Japan . |
| 3-53083A | 3/1991 | Japan . |
| 7-302789A | 11/1995 | Japan . |

*Primary Examiner*—Randy Gulakowski
*Assistant Examiner*—Anita Alanko
*Attorney, Agent, or Firm*—Myers Bigel Sibley & Sajovec, P.A.

[57] ABSTRACT

Solutions useful for etching semiconductor devices comprise ammonium fluoride, hydrofluoric acid, hydrogen peroxide, and water. Processes for forming the solutions comprise mixing first solutions which comprise ammonium fluoride, hydrofluoric acid, and water with second solutions which comprise hydrogen peroxide and water to form the solutions of the invention. Methods for etching semiconductor devices comprise contacting the devices which comprise a substrate and oxide layer thereon with the solutions of the invention to etch the devices. The oxide layer, for example a damaged silicon oxide layer on a silicon substrate, is selectively etched to the substrate.

5 Claims, 2 Drawing Sheets

ADJUSTABLE SELECTIVITY ETCHING SOLUTIONS AND METHODS OF ETCHING SEMICONDUCTOR DEVICES USING THE SAME

FIELD OF THE INVENTION

The present invention relates to solutions used in etching semiconductor devices and methods of using the same. More particularly, the present invention relates to solutions which possess adjustable etching selectivities of device substrates relative to corresponding oxide layers and methods of using the same.

BACKGROUND OF THE INVENTION

In general, the vertical structures of semiconductor devices have become more complex due to the increased integration density of the devices. As a result, the etching and cleaning processes which are employed in forming micro-patterns in the semiconductor devices have become more difficult. In particular, high energy ions are used to etch substrates, typically silicon substrates, forming isolation trenches of capacitors and other structures. As a result, a damaged silicon layer is usually generated. This is disadvantageous in that the presence of the damaged layer leads to potential performance degradation of the semiconductor device. Removal of the damaged layer is therefore important.

FIGS. 1 through 3 illustrate conventional methods for removing damaged silicon layers in semiconductor devices. FIG. 1 shows the formation of a first oxide layer 12, typically silicon dioxide formed by thermal oxidation, and a second oxide layer 14, typically by chemical vapor deposition (CVD) on a semiconductor substrate 10. The substrate 10 is then etched to form a trench 16. The trench 16 is typically formed by anisotropically etching in sequence, the second oxide layer 14, the first oxide layer 12, and the silicon substrate 10. High energy ions are used in the anisotropic etching. At this time, a silicon layer damaged by the high energy ions is formed under the trench 16.

FIG. 2 illustrates the conventional step of removing the damaged silicon layer, denoted by 17. More specifically, the damaged layer 17 is typically removed by a solution containing nitric acid ($HNO_3$) and hydrofluoric acid (HF). Employing such a solution may present disadvantages. For example, the rate of etching silicon with the solution (several $\mu$m/min) is extremely high in view of the desired etching thickness of the silicon (tens of nm). As a result, the use of the solution may be impractical since conventional contact times remove excessive amounts of silicon. An attempt to slow the etching rate of the solution by utilizing a diluted solution typically does not solve the above problem since the etching distribution of diluted solution is wide, ranging from several nm to tens of nm. Moreover, because the etching rate of the silicon dioxide layer is about 1/10th that of the silicon substrate, an undercut represented by the reference symbol "A" in FIG. 2 is often formed. As a result, subsequent filling of the trench is made difficult. Other problems are caused by the presence of the undercut. In FIG. 3, for example, a third oxide layer 18 and a polysilicon layer 30 are formed to fill the trench. Nonetheless, because of the undercut, a cavity 21 is disadvantageously generated inside the trench.

Other solutions have been used in attempting to remove the damaged silicon layer, namely diluted hydrofluoric acid solutions. Use of these solutions, however, is not desirable, since additional oxidation processes and cost are usually required in order to remove the damaged silicon layer.

In view of the above, there is a need in the art to provide solutions for etching semiconductor devices which exhibit more adjustable etching selectivity of the substrate relative to the oxide layer so as to maximize etching efficiency.

There is also a need in the art to provide methods for etching semiconductor devices with the solutions which are relatively simple.

SUMMARY OF THE INVENTION

In view of the above, it is an object of the present invention to provide solutions useful for etching semiconductor devices which exhibit more adjustable etching selectivity of the substrate relative to an oxide layer so as to maximize etching efficiency.

It is a further object of the present invention to provide methods for etching semiconductor devices with the solutions which are relatively simple.

These and other objects, features, and advantages are provided by the solutions of the present invention. In particular, the solutions comprise ammonium fluoride, hydrofluoric acid, hydrogen peroxide, and water. For the purposes of the invention, the water which is preferably used is deionized water. In one preferred embodiment, the weight ratio of ammonium fluoride to hydrofluoric acid in the solution is 7 to 1. Optionally, the solutions may include a surfactant.

The invention also provides processes for forming solutions useful for etching semiconductor devices. The processes comprise mixing a first solution comprising ammonium fluoride, hydrofluoric acid, and water with a second solution comprising hydrogen peroxide and water to form the etching solutions of the present invention. During mixing of the first and second solutions, it is preferred that the volume ratio of the first solution to the second solution be no greater than 1 to 25. In one preferred embodiment, the first solution comprises 18 percent by weight of water. In another preferred embodiment, the weight ratio of ammonium fluoride to hydrofluoric acid is 7 to 1. With respect to the second solution, it is preferred that the weight ratio of hydrogen peroxide to water be 3 to 7.

Moreover, the present invention provides methods for etching semiconductor devices. The methods comprise contacting semiconductor devices with solutions comprising ammonium fluoride, hydrofluoric acid, hydrogen peroxide, and water to etch the semiconductor devices. The semiconductor devices which are etched comprise a substrate and an oxide layer present thereon. Preferably, the substrate comprises silicon and the oxide layer comprises silicon dioxide.

DETAILED DESCRIPTION OF THE PREFERRED EMBODIMENTS

Figure 1:
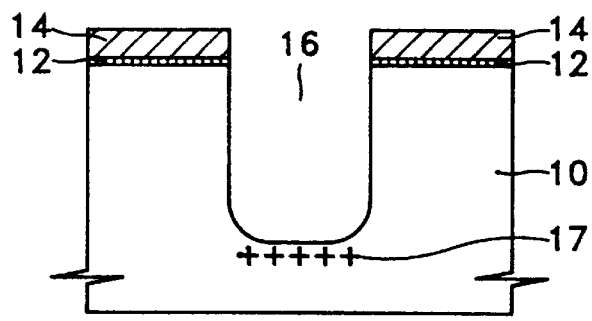
FIGS. 1 through 3 represent cross sections of semiconductor devices which aid in illustrating prior art methods of etching semiconductor devices.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of the layers and regions are exaggerated for clarity. Like numbers refer to like elements throughout.

The present invention relates to solutions useful for etching semiconductor devices. The solutions include ammonium fluoride ($NH_4F$), hydrofluoric acid (HF), hydrogen peroxide ($H_2O_2$), and water. Preferably, deionized water is employed. The components may be employed in various amounts. In a preferred embodiment, the weight ratio of ammonium fluoride to hydrofluoric acid in the solution is 7 to 1. The solutions may include other various components. For example, the solutions can include surfactants to improve the wetting characteristics of the solutions on the devices by lowering the interfacial energies of the solutions.

The invention also provides methods for forming solutions useful in etching semiconductor devices. The methods include mixing a first solution containing ammonium fluoride, hydrofluoric acid, and water with a second solution containing hydrogen peroxide and water to form the etching solutions of the invention.

Other known and appropriate components may be provided in the first and second solutions, such as, for example, a surfactant. Mixing of the first and second solutions may be carried out in any suitable manner known to the skilled artisan.

The first solution and the second solution can be used in a wide range of amounts. Preferably, the volume ratio of the first solution to the second solution is no greater than 1 to 25. The components present in the first and second solutions may be employed in various amounts. In a preferred embodiment, the weight ratio of ammonium fluoride to hydrofluoric acid in the first solution is 7 to 1. In addition to this ratio, the first solution most preferably contains 18 percent by weight by water. Moreover, with respect to the second solution, the weight ratio of hydrogen peroxide to water is preferably 3 to 7.

The invention additionally relates to methods of etching semiconductor devices. The methods include contacting semiconductor devices with the solutions of the invention to etch the semiconductor devices. A semiconductor device includes a substrate and an oxide layer which is present on the substrate. Preferably, the substrate is formed from silicon, such as monocrystalline silicon for example, and the oxide layer is formed from silicon dioxide.

Figure 4:
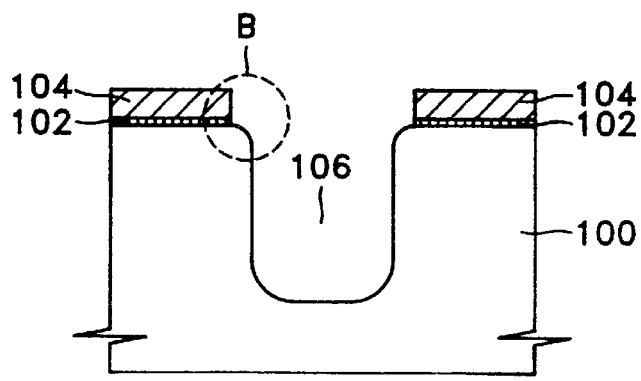
FIG. 4 represents a cross section of a semiconductor device which aids in illustrating a method of etching a semiconductor device according to the present invention.
Figure 5:
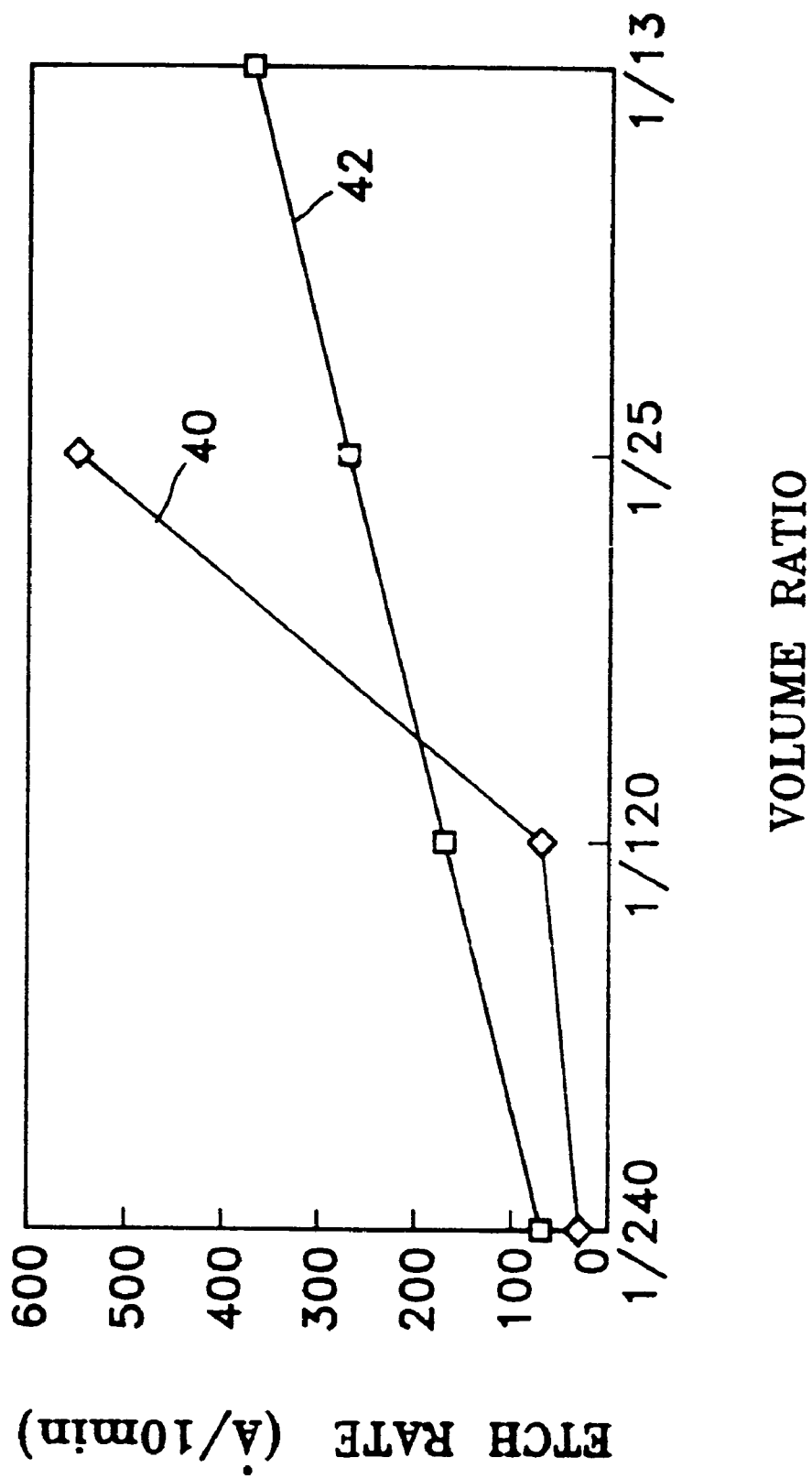
FIG. 5 represents a graph illustrating the etching rates of an oxide layer and a silicon substrate using a solution of the present invention.

FIGS. 4 and 5 illustrate in greater detail the methods of etching the semiconductor devices in accordance with the present invention. As seen in FIG. 4, a first oxide layer 102 is present on a semiconductor substrate 100, the layer 102 typically being formed by a conventional thermal oxidation method. A second oxide layer 104 is present on the first oxide layer 102, and is typically formed by a conventional chemical vapor deposition (CVD) method. A trench 106 is formed by a suitable method such as, for example, anisotropically etching the second oxide layer 104, the first oxide layer 102, and the substrate 100, usually in this sequence. A layer of material, typically silicon (not shown), which has been damaged by ions of high energy used during etching, is present under trench 106.

Figure 2:
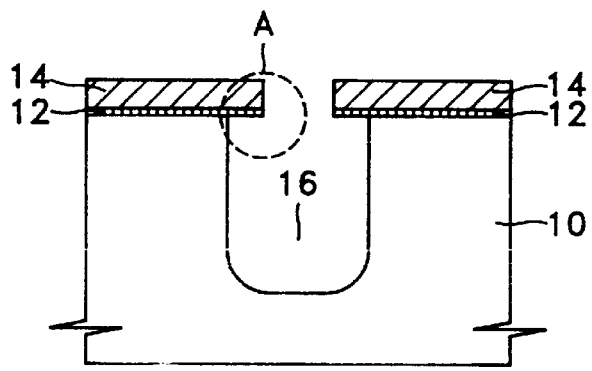
Figure 3:
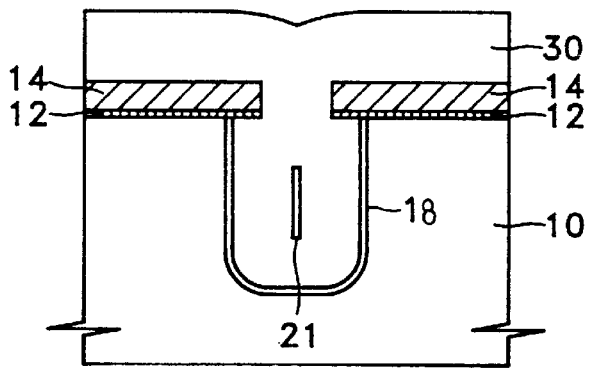

In accordance with the invention, the damaged layer of material is contacted by the solution of the present invention so as to become etched. FIG. 5 illustrates the etching rates of a silicon substrate and a silicon oxide layer. As shown, the X axis denotes the volume ratio of a first solution containing ammonium fluoride and hydrofluoric acid to a second solution containing hydrogen peroxide and deionized water. The volume ratio of the first solution relative to the second solution ranges from 1/240 to 1/25. The Y axis denotes etching rates of the silicon substrate (indicated by a line labeled 42) and the silicon dioxide layer (indicated by a line labeled 40). Referring to FIG. 5, when the etching selectivity of the oxide layer is maintained between about 0.5 to 3, the etching depth of the silicon substrate can be advantageously adjusted between 50 and 300 Å/10 min. This can minimize the undercut phenomenon as illustrated by reference symbol B shown in FIG. 4 in comparison to the undercut present in a prior art device shown in FIG. 2. Moreover, the etching uniformity of the solution of the present invention can be advantageously adjusted by about 3 percent.

Subsequent to the etching method of the present invention being carried out, a third oxide layer (not shown) may be formed on the surface of the trench. A layer of polysilicon may be formed in the trench to fill the trench. Subsequent manufacturing processes of the semiconductor devices etched by the methods of the invention may then be carried out.

The solutions of the present invention are highly useful. For example, the solutions allow for ready adjustment of the etching selectivity of the substrate and oxide layers to minimize processing complications associated with the semiconductor devices while achieving a maximum etching effects. The components present within the solutions allow for the above to occur. Specifically, the hydrogen peroxide oxidizes the surface of the substrates with the hydrofluoric acid removing the oxidized substrate surfaces. Advantageously, the presence of the ammonium fluoride uniformly maintains the concentration of the hydrofluoric acid so as allow for simple, efficient etching of the semiconductor devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of etching a semiconductor device comprising:

contacting a semiconductor device comprising a substrate and an oxide layer present on the substrate with a solution comprising ammonium fluoride, hydrofluoric acid, hydrogen peroxide, and water to etch the semiconductor device such that the etching selectivity of the oxide layer relative to the substrate ranges from 0.5 to 3, and wherein the etching solution is formed by the process of mixing a first solution comprising ammonium fluoride, hydrofluoric acid, and water with a second solution comprising hydrogen peroxide and water to form the etching solution, the weight ratio of the hydrogen peroxide to water in the second solution being 3 to 7, and wherein during the step of mixing the first and second solutions, the volume ratio of the first solution to the second solution is no greater than 1/25.

2. A method of etching a semiconductor device according to claim 1, wherein the substrate comprises silicon and the oxide layer comprises silicon dioxide.

3. A method of etching a semiconductor device according to claim 1, wherein the water is deionized water.

4. A method of etching a semiconductor device according to claim 1, wherein the solution further comprises a surfactant.

5. A method of etching a semiconductor device according to claim 1, wherein the first solution comprises 18 percent by weight of water.

\* \* \* \* \*